US009330211B2

(12) United States Patent
Papariello et al.

(10) Patent No.: US 9,330,211 B2
(45) Date of Patent: May 3, 2016

(54) SIMULATION SYSTEM FOR IMPLEMENTING COMPUTING DEVICE MODELS IN A MULTI-SIMULATION ENVIRONMENT

(75) Inventors: Francesco Papariello, San Fermo della Battaglia (IT); Giuseppe Desoli, San Fermo della Battaglia (IT)

(73) Assignee: STMicroeletronics S.R.L., Agrate Brianza (IT)

( * ) Notice: Subject to any disclaimer, the term of this patent is extended or adjusted under 35 U.S.C. 154(b) by 1241 days.

(21) Appl. No.: 13/230,135

(22) Filed: Sep. 12, 2011

(65) Prior Publication Data
US 2012/0116746 A1 May 10, 2012

(30) Foreign Application Priority Data

Sep. 10, 2010 (IT) ................ VI2010A0245

(51) Int. Cl.
| G06F 9/44 | (2006.01) |
| G06F 13/10 | (2006.01) |
| G06F 13/12 | (2006.01) |
| G06F 9/45 | (2006.01) |
| G06F 17/50 | (2006.01) |
| G06F 9/455 | (2006.01) |

(52) U.S. Cl.
CPC .......... *G06F 17/5022* (2013.01); *G06F 9/455* (2013.01); *G06F 17/5009* (2013.01); *G06F 17/5036* (2013.01)

(58) Field of Classification Search
CPC .. G06F 17/5009; G06F 17/5036; G06F 9/455
USPC ............................. 703/22, 26, 21
See application file for complete search history.

(56) References Cited

U.S. PATENT DOCUMENTS

2007/0233825 A1\* 10/2007 Brownell et al. ............. 709/220
2012/0029900 A1\* 2/2012 Papariello ..................... 703/21

OTHER PUBLICATIONS

Adam Rose, NPL, "Transaction Level Modeling in SystemC", 2005.\*
Search Report for Italian Application Serial No. VI20100245, Ministero dello Sviluppo Economico, Munich, Apr. 20, 2011, pp. 2.
Adam Rose, Stuart Swan, John Pierce, Jean-Michel Fernandez, "Transaction Level Modeling in SystemC", Open SystemC Initiative (OSCI) TLM Working Group Whitepaper, 2005 XP-002633707, pp. 16.
Rabie Ben Atitallah, Smail Niar, Samy Meflali, Jean-Luc Dekeyser, "An MPSoC Performance Estimation Framework Using Transaction Level Modeling", Embedded and Real-Time Computing Systems and Applicat10ns, 2007. RTCSA 2007. 13th IEEE International Conference on, IEEE, Piscataway, NJ, USA, Aug. 21, 2007, pp. 52S-533, XP031534990.
Maman Abdurohman, Sarwono Sutikno, Kuspriyanto, Arif Sasongko, "Transaction Level Modeling for Early Verification on Embedded System Design" Computer and Information Science, 2009. ICIS 2009. Eighth IEEE/ACIS International Conference on, IEEE, Piscataway, NJ, USA, Jun. 1, 2009, pp. 277-282, XP031519277.

\* cited by examiner

*Primary Examiner* — Thai Phan
(74) *Attorney, Agent, or Firm* — Seed IP Law Group PLLC

(57) ABSTRACT

An embodiment of a simulation tool includes a path determiner and a simulator. The path determiner is configured to identify a first communication path between first and second devices of a system, and the simulator is configured to simulate a routing of a first item from one of the first and second devices to the other of the first and second devices via the identified path. The path determiner may also be configured to identify the communication path before the simulator simulates the routing of the item, or to identify the communication path while the simulator is inactive.

12 Claims, 13 Drawing Sheets

(We are still considering the case of single-core platforms but the situation depicted here allows defining the concept of channels)

1200

SIMULATION SYSTEM FOR IMPLEMENTING COMPUTING DEVICE MODELS IN A MULTI-SIMULATION ENVIRONMENT

PRIORITY CLAIM

The present application claims the benefit of Italian Patent Application No. VI2010A000245, filed Sep. 10, 2010, which application is incorporated herein by reference in its entirety.

TECHNICAL FIELD

Generally, an embodiment relates to a computer system that is configured for simulating a device model of a multi-IP hardware platform based on arranging the IP-devices of the model that are sensitive to operations originating from the top in n number of stacks ordered from the nearest to the transaction initiator to the farthest from it, arranging the devices of the model that are sensitive to operations arriving from the bottom in y number of stacks ordered from the farthest from the transaction initiator to the nearest to it, considering for each device coupled to the transaction initiator the start and end address of each memory region the device is mapped onto, and splitting all device regions such that there is no region placed across other regions' boundaries.

BACKGROUND

Electronic hardware used for the vast majority of equipment used in both private and professional environments basically is implemented as computing-like devices. Such devices, even though not constituting a general purpose computer, do still constitute a computing device in that they are built from numerous electronic elements or rather electronic devices of different types that are coupled to each other via a bus-like data connection.

During the design phase of such a computing device, of course, the reliability of the flow data and/or transactions within the device is tested to ensure that data and/or instructions are routed throughout the electronic devices along the logically defined paths of the chosen protocol according to the inherent logic of the computing device and the electronic devices contained therein. One basis of such defined flow of data and/or instructions is that each electronic device forming a part of the overall computing system has an address space assigned thereto such that each data and/or instruction packet holding such address is carried along the connections and/or the bus of the computing device such that it is routed to the particular electronic device that has the respective address assigned to it.

The electronic devices (hardware) of such computer devices can be distinguished using classifications of devices. One general classification is the one of transaction initiators—electronic devices capable of initiating a transaction within the system of the computing device autonomously—on the one hand, and devices or slave IPs—electronic devices that are incapable of initiating a transaction within the system of the computing device autonomously—on the other hand. Transaction initiators can, for example, be CPUs ("central processing unit"), DMAs ("Direct Memory Access"), hardware accelerators, and the like. Devices or slave IPs coupled to such transaction initiators are, for example, busses, networks, memories, caches, and the like. Typically, each transaction initiator is coupled to some devices, and the transaction initiator with the devices coupled thereto constitutes a subsystem. However, devices may also be shared amongst initiators.

Such computing devices formed on the basis of hardware platforms bundling numerous electronic devices are designed to fulfill various purposes, very complex ones where they may even form a general purpose computer but also rather simple ones, where computing devices support the design of, for example, consumer electronic devices like, for example, MP3 players and the like. In any event, optimized hardware configuration is desirable to achieve both optimized performance in terms of reliability and speed as well as optimized production costs. Thus, before finalizing the hardware design of such hardware platforms, e.g., the layout and choice of implemented electronic devices, it is general practice to (virtually) simulate the behavior of the developed hardware platform to get a better insight into the data and instruction flow between the various devices forming the platform and to further optimize the logical interaction of the various initiators and devices that form the respective system. To allow such simulation, simulation models are built representing the physical structure of the electronic platform, the data connections, the electronic devices being present, the logical topology, and the like. Such partial models are aggregated to form an overall simulation model of such hardware platforms that allow for performing respective simulation in computer-based simulation environments in order to simulate and potentially optimize the interconnectivity and logical address space. Such electronic circuit simulation uses mathematical models to replicate the behavior of the actual electronic devices and/or circuits used in the platform. Simulating a device's behavior before actually building it greatly improves efficiency and provides insights into the behavior of the overall electronic circuit design. In particular, for integrated circuits (IC), the tooling is expensive, breadboards are impractical, and probing the behavior of internal signals is extremely difficult. Electronics simulators generally integrate an editor, a simulation engine, and model and device libraries. These models typically include generic components or rather common devices like memories, buses, switches, and, in some cases, also cores and also user-defined models.

This modeling and simulation however, is a burdensome activity. In particular, for the time spent by a simulator system for simulating a multi-IP platform (simulation time) there are two main determinants: (1) the time spent by each IP (master device or slave device) for simulating all operations remaining in that IP itself; and (2) the time spent by IPs for communicating amongst each other.

The weight of the first determinant is relevant for rather complex devices (i.e., device models), for example for cores. The weight of the second determinant rather depends on the configuration of the multi-IP platform that is to be modeled. Factors determining this complexity of the configuration are, for example, the topology of the platform, the number and types of IPs or rather devices (not their complexity in itself) constituting the system, and also the specific kind of transaction flows throughout the platform. In particular, traversing the hierarchy of structure elements and the address space can be very time consuming.

SUMMARY

Therefore, there is a need for an improved method and system for simulating hardware platforms that comprise multiple initiators and devices.

An embodiment is a computer-implemented method for implementing and simulating, in a software-based simulation environment, hardware and device structures of multi-device platforms enabling high speed routing and dispatching of a given transaction to all simulation entities being involved in that given transaction.

In particular, an embodiment includes the steps of providing, for each electronic device in a multi-device platform, a device model for simulation in a software-based simulation environment, each device model storing a set of properties, the set of properties at least including a proximity value, and categorizing one or more of the device models as an initiator model; joining the device and the one or more initiator models in the simulation environment to form one or more simulation subsystems, each subsystem including one of the one or more initiator models and the device models that are coupled to that one initiator, and combining the subsystems in the simulation environment to form a simulation system model of the multi-device platform; and mapping each device onto one or more device regions of contiguous addresses in the address space of the system model.

In addition, an embodiment includes the steps of creating, for each of the one or more initiator models present in the system model, a layer by repeating for each of the one or more initiator models the steps of arranging based on the proximity value the device models that are sensitive to operations originating from the top of n stacks ordered from the nearest to the one or more initiator to the farthest from it; arranging based on the proximity value the devices that are sensitive to operations arriving from the bottom of y stacks ordered from the farthest from the one or more initiator to the nearest to it; considering for each device coupled to the one or more initiators the start and end addresses of each memory region the device is mapped onto; and splitting all the device regions so that there is no region placed across other regions' boundaries.

Thereby, an embodiment allows for determining statically, in response to a given transaction being received at a first device and resulting in the propagation of a transaction, the target device region of that propagated transaction. Thus, an embodiment addresses the second of the above-described two determinants for simulation time spent and eliminates almost completely the time spent by the simulator for deciding which IP is the target of a transaction, by moving most of this decision to an offline process that can be executed before the actual platform simulation is started.

According to a conventional technique, this decision of which target region to choose based on the address ranges associated with the given transaction is done at runtime of the software-based simulation environment. This, however, consumes significant simulation time and induces significant simulation costs as each choosing decision is made at runtime of the simulation. In particular, existing simulators compute the target IP each time a transaction is initiated by each IP. Therefore, in these simulators, traversing the hierarchy of structure elements and the address space is very expensive in terms of consuming simulation time.

In contrast, an embodiment is based on the specific insight that each time the choice of the target region of the given transaction is based upon the address of the transaction itself, this choosing of the target can be optimized. A further insight is that the case of the choice of the target region being based upon the address of the given transaction occurs in the vast majority of cases of transaction initiation in the simulation model.

Thus, an embodiment improves modeling of hardware structures of multi-IP platforms in a simulation environment such that their topologies, both in terms of interconnectivity and logical address partitioning, can be simulated and optimized efficiently.

In particular, this task, known to be rather complex and simulation-time and cost consuming, in particular with respect to traversing the hierarchy of the devices and initiators in the system model, may be optimized by partitioning the address space of the system model such that once a slice of the address space is determined where the transaction starts, the list of IPs involved in this transaction can be determined statically—at a fraction of the otherwise consumed simulation time and cost. Thus, if the device does not change the address of the transaction, which applies in the vast majority of cases, propagating of the given transaction to the next device is simplified in terms of sending it to the device region occupying the statically determined next-address position. Further, there is a spatial proximity between the address ranges, referenced at almost the same time. This is based on the specific insight that if a particular address range is referenced at a particular time, then it is likely that nearby address ranges will be referenced in the near future. Thus, there may be a high probability that if the address of the given transaction is contained in a particular address range, the next transaction will regard the same address range.

Thus, in a further embodiment, at least one device model is shared between more than one initiator. In an even further embodiment, the shared device model is configured as a bus, the bus device performing, based on the proximity values, as a switch by changing the layer and propagating the given transaction to the device region that is logically after the bus farthest from the initiator having initiated the given transaction if the bus model can determine that the target device region to access is farther from the initiator with respect to the bus, or propagating the given transaction to the device region that is logically before the bus nearest to the initiator if the bus determines that the target device region is nearer to the initiator with respect to the bus. In an even further embodiment, the bus device is programmed to discriminate between types of devices it can access and to offline scan the system model topology for determining for each address range the destination layer and the direction in terms of top-to-bottom or bottom-to-top operations.

In a further embodiment, a simulation kernel of the simulation environment is part of the initiator model that originated the given transactions.

In an even further embodiment, a device page with reasonable size is defined and device regions occupying only a portion of that page are considered as if they occupied the entire page. This may introduce a small requirement to the expected behavior of each region handler in a device model, because it can receive also requests that are not directed to it. Each region handler code, therefore, filters those corner cases by testing if it really mapped the effective address of a request, and if so, processing it or alternatively by propagating it, preserving its direction and channel.

In a further embodiment, a computer-readable medium is provided having stored thereon computer-readable instructions that, when run on a computer, are configured for performing the steps of any of the above described embodiments.

A further embodiment is a computer-implemented and software-based simulation system for implementing and simulating hardware and device structures of multi-device platforms enabling high-speed routing and dispatching of a given transaction to all simulation entities being involved in that given transaction.

The system includes device models for simulation in a software-based simulation environment for each electronic device in a multi-device platform, each device model storing a set of properties, the set of properties at least including a proximity value, and categorizing one or more of the device models as an initiator model; simulation subsystems formed based on joining the device and one initiator model in the simulation environment, each subsystem including one of the one or more initiator models and the device models that are coupled to that one initiator; and a simulation system model formed based on combining the subsystems in the simulation environment.

The system further includes means for mapping each device onto one or more device regions of contiguous addresses in the address space of the system model, and means for creating for each initiator model present in the system model a layer by repeating for each initiator model the steps of arranging based on the proximity value the device models that are sensitive to operations originating from the top in n stacks ordered from the nearest to the initiator to the farthest from it; arranging based on the proximity value the devices that are sensitive to operations arriving from the bottom in n stacks ordered from the farthest from the initiator to the nearest to it; considering for each device coupled to each initiators the start and end addresses of each memory region the device is mapped onto; and splitting all the device regions so that there is no region placed across other regions' boundaries.

Finally, the system includes means for statically determining, in response to a given transaction being received at a first device and resulting in the propagation of a transaction, the target device region of that propagated transaction.

BRIEF DESCRIPTION OF THE DRAWINGS

One or more embodiments are described in the following with reference to the accompanied drawings, in which.

DETAILED DESCRIPTION

Before describing the above-enumerated figures in detail, some definitions and conventions are introduced that are used throughout the description according to the following understanding:

1. "Device": The device or slave IP is the (partial) simulation model of a system device, i.e., an electronic device that cannot initiate a transaction within the hardware platform autonomously. Devices can be, amongst others, caches, memories, networks, busses, MMUs (memory management unit), and the like. Each device holds/stores a set of properties. These properties may include the proximity of the device to the initiator of the subsystem to which the device is assigned.

2. "Subsystem": A subsystem includes a transaction initiator and the devices that are directly coupled to the transaction initiator.

3. "Proximity": Proximity is a property value determined for and held by each device, and that describes the distance in terms of the device's topological placement relative to other devices, in particular the topological placement of the device relative to the transaction initiator to which the device is coupled.

4. "Device region": A device region is a region, or a number of contiguous addresses, in the address space of the system and onto which a device is mapped. Each device is mapped onto at least one region but can also be mapped onto more than one region.

5. "Channel": Channels are a part of a device region, i.e., each device region has one or more channels. Each channel is characterized by the type of operations it can handle, for example, instruction operations, data operations, or other operations. Further, each channel is characterized by the direction from where it can receive operation and/or data requests. For modeling and simulating a hardware platform, at least two types of possible directions may be distinguished: a first possible operation direction is top-to-bottom, i.e., the operation is originated by the initiator and traverses to a device; another, second operation direction is bottom-to-top, i.e., this operation is directed to the initiator.

6. "Transaction initiator": Transaction initiators, or initiators or master IPs, are the (partial) simulation model of a system component, for example an electronic device or electronic component that can initiate a transaction autonomously within the system. Examples of initiators or master IPs are CPUs, DMAs, hardware accelerators, and the like.

7. "IP": IPs can indicate both a master IP or a slave IP; here, a slave IP is used as a synonym for "device" and master IP is used as a synonym for an "initiator". Each IP is an electronic component or electronic device forming part of the overall hardware platform simulated. IP indicates that each of these devices has logical address space assigned thereto that conforms to the data protocol used for the particular hardware platform.

Figure 1:
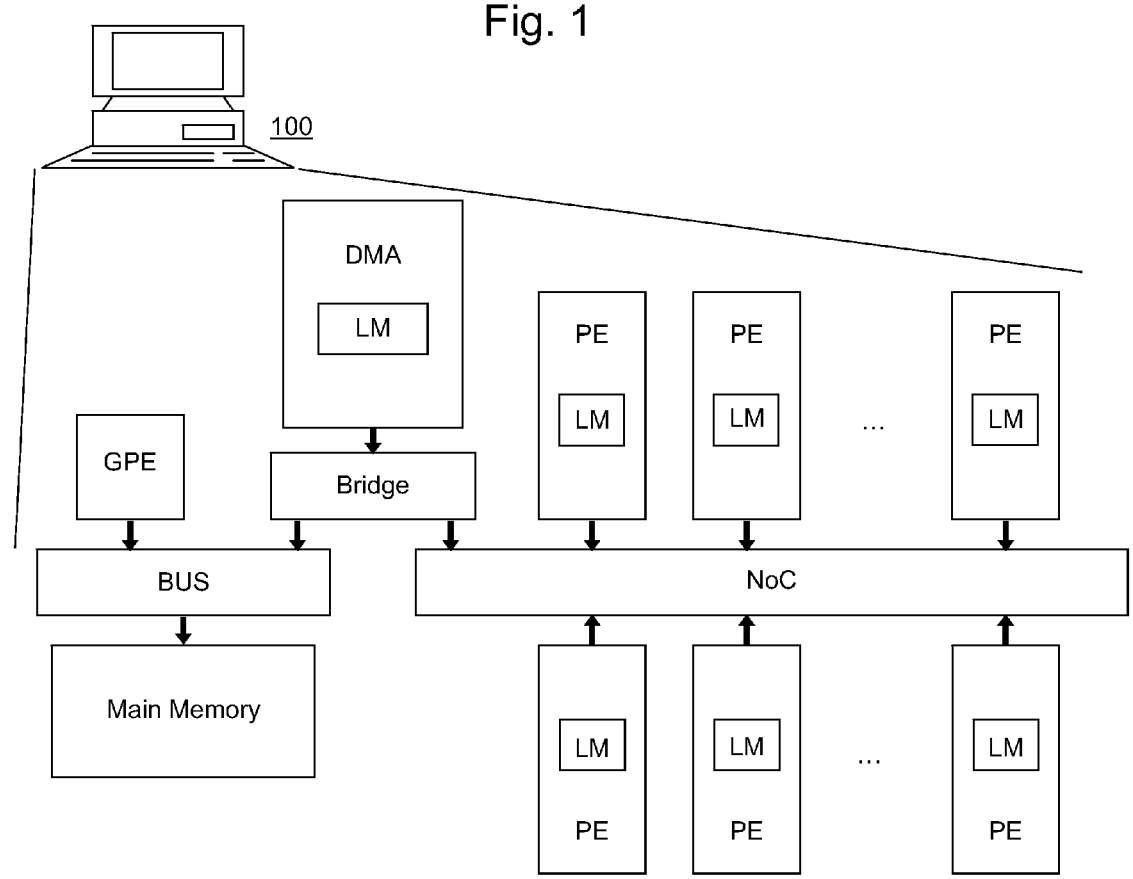
FIG. 1 shows a real-life example of a multi-IP platform in accordance with an embodiment.

Turning now to FIG. 1, hardware platform 100 is depicted here as a computing device 100. However, computing device 100 is depicted here as a general purpose computer only in terms of an illustrative example. Alternatively, hardware platform 100 could form any other kind of computing device, computing-like device, and/or hardware structure composed by electronic components/devices coupled via networks, busses and the like. Therefore, also the number and types of electronic components depicted in FIG. 1 has only an illustrative character and therefore also a differing number and other types of devices could be used according to an embodiment to implement such hardware platform 100.

The hardware platform 100 shows a platform with several transaction initiators, in particular a DMA and some hardware accelerators or programmable hardware accelerators (Processing Elements or the PEs). Furthermore, the hardware platform 100 includes devices like, for example, a BUS, a Main Memory, an NoC ("Network-on-Chip"), and a Bridge.

As illustrated in FIG. 1, the transaction initiators are coupled to the devices, and at least some of the devices are shared amongst several initiators, this for example applies to the device BUS. Thus, this exemplary multi-processor platform is composed of a GPE and a regular array of PE processors or hardware accelerators. Each processor or hardware accelerator has its own distributed but uniform memory address space. Thus, the exemplary multi-IP platform of FIG. 1 can be an example of a generic multimedia streaming multi-processor, which is becoming common not only in standalone devices (DVD or Blu-ray® players, set-top boxes, etc.), but also in mobile devices (mobile phones, smart phones, etc.).

Figure 2:
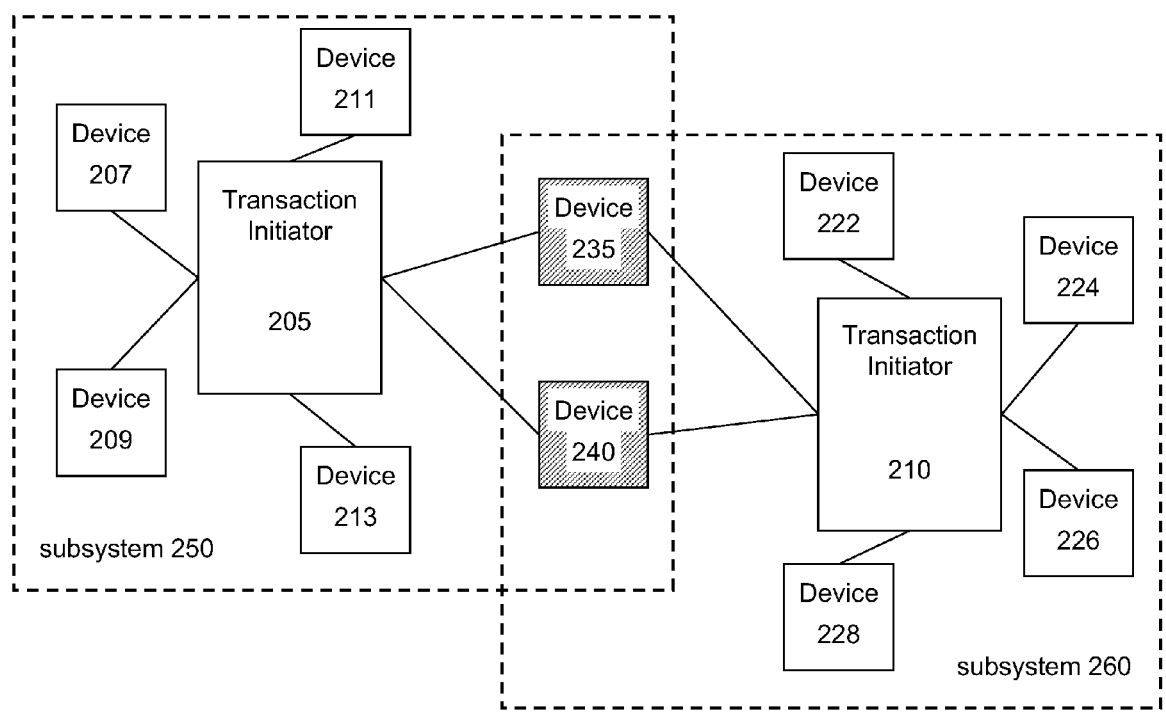
FIG. 2 shows simplified multi-IP platform with shared devices in accordance with an embodiment.

Turning now to FIG. 2, here a basic architecture of a multi-IP hardware platform as has been outlined in FIG. 1 is illustrated in a simplified manner. FIG. 2 shows a hardware platform as an abstract model of electronic components 205 to 240 that are intercoupled with each other by means of data connections which can, for example, be a bus or a network and the like. As an illustrated example, the number of devices, transaction initiators, and the characteristics of the data connections depicted in FIG. 2 are just exemplary with respect to an embodiment. Therefore, the principles disclosed can be applied to any hardware platform including different numbers of transaction initiators, devices, or different kinds of data connections.

In FIG. 2, it is illustrated that transaction initiators 205/210 are coupled to devices 207-240. In particular, transaction initiator 205 is coupled to six devices, namely devices 207 to 213, and devices 235/240. The transaction initiator 205 along with its coupled devices forms a subsystem 250. Similarly, transaction initiator 210 is coupled to devices 222 to 228 and devices 235 and 240, thus forming a subsystem 260. From the illustrative example, it can be seen that at least two devices are shared amongst the transaction initiators 205/210, in particular the devices 235 and 240.

An embodiments of a simulation method and system described in the following address the modeling of hardware structures of multi-IP platforms in a simulation environment such that their topologies, both in terms of interconnectivity and logical address partitioning, can be simulated and optimized efficiently. This task is generally known to be rather complex and in particular, traversing the hierarchy of the devices and initiators included in the simulated hardware platform can be time consuming for the simulator application. In an embodiment, the methods and systems according to the embodiment may allow a high-speed routing and dispatching of a given transaction that occurs in the simulated hardware platform to all of the simulation entities that are involved in the given transaction. This is further highlighted based on the example of a simplified model of a single initiator hardware platform depicted in FIG. 3.

Figure 3:
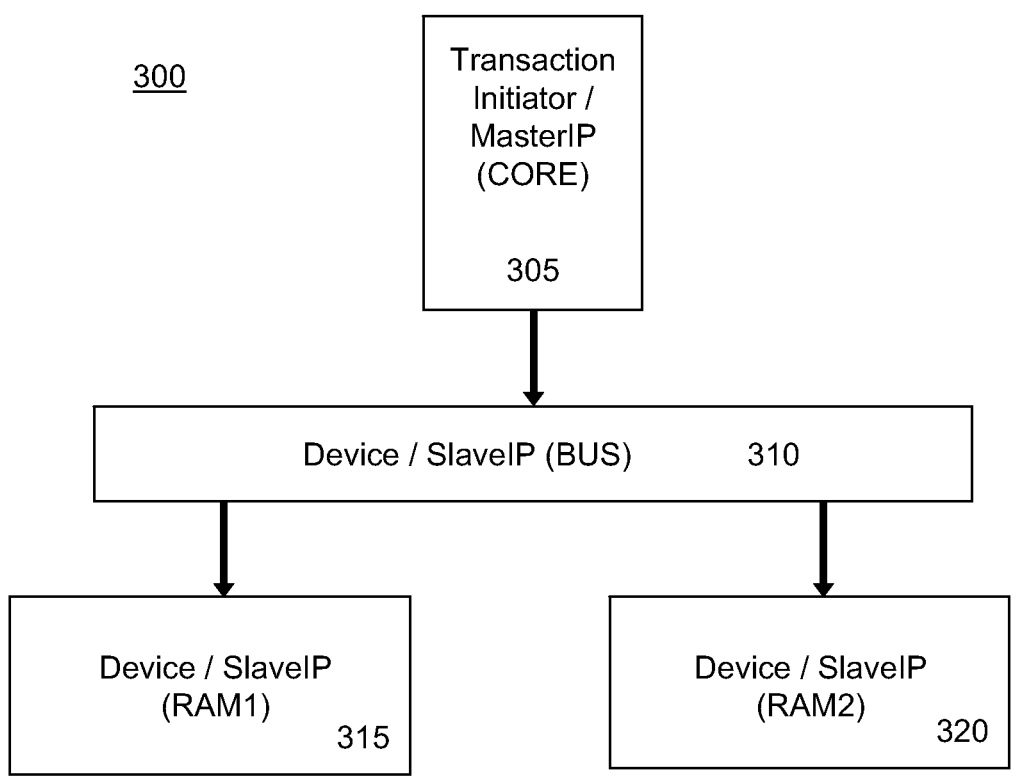
FIG. 3 shows a simplified example of a hardware platform having only one initiator.

FIG. 3 shows a simplified model of a computing device platform 300. The computing device model 300 includes one master IP or initiator 305 and three devices or slave IPs 310 to 320. As depicted in FIG. 3, in this illustrative example, the sole master IP of the hardware platform is a CORE 305. Furthermore, the device 310 is the system bus 310. The two slave IPs 315, 320 are RAM components, namely RAM 1 (315) and RAM 2 (320).

The data and instruction connections between the different IPs 305-320 of the system 300 are generally implemented using means of connecting input and out ports of the IPs 305-320. Thus, each IP 305 to 320 has some input ports and some output ports. To create logical flow of instructions and/or data between the elements 305-320 of the simulated hardware platform or system 300, the output ports of IPs 305-320 are coupled to input ports of other IPs 305-320. The intelligence for choosing which output port to use and how this output port is to be used resides in the model of each IP 305-320. The term "model" is used here and throughout the description as a synonym for a simulation model of either an electronic component or electronic device 305-320 and/or the overall hardware platform 300, which is later on implemented in physical hardware constituting the computing platform 300. For testing and optimizing purposes, however, this hardware platform is, before physical implementation, logically modeled in a simulation environment such that the behavior of the later-used hardware components may be observed and optimized.

In the example of simulation model 300, the input and output ports of device 310 (bus) are configured such that these ports are mapped onto (a number of) addresses in the address space of system 300. These addresses are modeled according to a number of contiguous addresses that are assigned to each device 315 and 320. In particular, ports of bus 310 are mapped onto addresses [base 1 . . . end 1] (RAM 1) and [base 2 . . . end 2] (RAM 2) for the devices RAM 1 (315) and RAM 2 (320), respectively. Thus, each time the simulation model of bus 310 receives a request contained in the first range of addresses [base 1 . . . end 1], the simulation model of bus 310 propagates this request to RAM 1 (315) as this address space [base 1 . . . end 1] is mapped onto device 315. Similarly, when the bus model receives another request contained in the second range of addresses [base 2 . . . end 2], the simulation model of bus 310 propagates this request to RAM 2 (320) as this address space [base 2 . . . end 2] is mapped onto device 320. All requests initiated by transaction initiator 305 to addresses that are outside of the two ranges [base 1 . . . end 1] (RAM 1) and [base 2 . . . end 2] (RAM 2) generate a memory error. These memory errors are usually caught by CORE 305, which typically raises an exception on this event.

According to a known technique, the decision of which target to choose based on the address ranges associated with the initiated request is done at runtime of the simulation of the hardware platform 300. But this choosing at runtime consumes significant simulation time. Thus, systems and methods according to an embodiment rely on the specific insight that each time the choice of the target of a transaction is based upon the address of the transaction itself, the simulation time used for the choosing of the target may be reduced. It is noted that the case of the choice of the target being based upon the address of the transaction occurs in almost all cases of transactions.

Based on this insight, methods and systems according to an embodiment suggest partitioning the address space of the simulation model 300 and devices 305-320 such that once a slice of the address space is determined where the transaction starts, the list of IPs involved in this transaction can be determined statically in a contrast to the above-described determination at runtime, which may cause excessive simulation-time consumption. This partitioning is further illustrated in FIG. 4, which shows the hardware platform 300 of FIG. 3 with a partitioned address space according to an embodiment.

Particularly, the simulated hardware platform 300 is illustrated here as simulation model 400, which also takes the address space into account when modeling the respective hardware platform 300. Therefore, model 400 shows, similar to model 300, one master IP 405, slave IP (410) and two RAM components, RAM 1 (415) and RAM 2 (420). In addition, model 400 shows five transactions initiated by the master IP 405, namely the transactions T41 to T45. As outlined before, transaction T42 is a request initiated by master IP 405, which is contained in the first address range [base 1 . . . end 1] and, therefore, is propagated by slave IP 410 to device 415. Similarly, transaction T44 is contained in the second range of addresses [base 2 . . . end 2] and, therefore, is propagated by bus 410 to the device RAM 2 (420). The requests related to addresses outside of these two previously mentioned address ranges, namely transactions T41, T43, T45, generate a memory error indicated in model 400.

Figure 4:
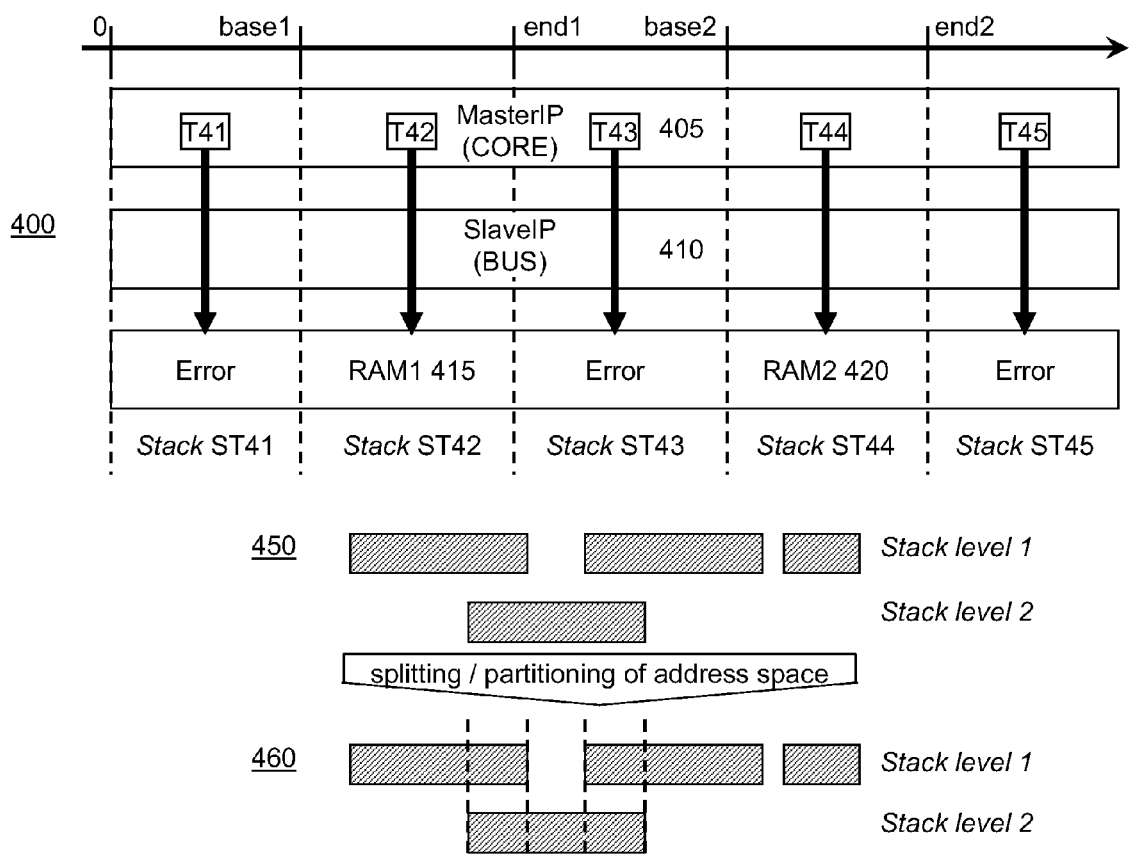
FIG. 4 shows the partitioning of the address space in accordance with an embodiment.

Thus, FIG. 4 illustrates stacks ST41-ST45 in terms of the vertical "slices" of addresses in the overall address space indicated in model 400 by the dotted lines. Moreover, as introduced earlier above, device regions are the intersection between a stack as a slice of addresses and a device 410-420 with its address space assigned thereto. The term "device region" thus relates to a dedicated address space of a device 415 or device 420, as master IPs are mapped onto all addresses of the address space of the simulation model 400 by default.

Further, model 400 shows that a device 410 can be defined as having more than one region. Each of these regions may have a different set of properties, i.e., different functions implementing memory operations. For transactions initiated by master IP 405, a very frequent case in a typical simulation model 400 is that the address of a transaction T41 to T45 does not change while traversing from the transaction initiator 405 to the target device 415. Thus, in this majority case, the transaction T42 stays in its stack ST42 and traverses the stack as T42 from the top, i.e., the master IP 405 that initiated the transaction, to the bottom, i.e., the target device 415. For the few cases where the address of a transaction changes (for example, if the transaction encounters a memory management unit, MMU), the transaction is moved to the corresponding stack and stays in this stack unless another address shift occurs.

The effect of this splitting, or rather partitioning, of device regions, i.e., regions of contiguous addresses onto which a device is mapped, is further illustrated in FIG. 4 by the transformation of simulation model 450 to the simulation model 460. In particular, simulation model 450, as well as simulation model 460, show two stack levels, namely stack level 1 and stack level 2. As indicated in model 450, the address space of the devices in stack level 2 overlap device regions of stack level 1. However, an embodiment splits, or rather partitions, the address space such that after this operation, simulation model 460 is created, which by the dotted lines indicates that device regions of stack level 1 and stack level 2 are split such that there are no device regions across other regions' boundaries. The "slices" indicated by the dotted lines conform to the stacks ST41 to ST45 of model 400.

This splitting of regions is achieved by arranging devices 410 to 420 into stacks. In particular, when considering one initiator 405 and the devices 410 to 420 that it can directly access at a time, those devices 410-420 that are sensitive to operations originating from the top are arranged in n stacks (one per type of the operation supported by the devices) ordered from the nearest in terms of proximity to the initiator through the farthest from it. The term "nearest" and "farthest" refer to the property of "proximity" that is an element of the set of properties stored in each device 410 to 420.

Furthermore, those devices that are sensitive to operations arriving from the bottom are arranged in y stacks (1 per type of the operation supported by the devices) ordered from the farthest from the initiator to the nearest in terms of their proximity; it is possible that y=n. Based on these stacks, for each device 410 and 420 that is coupled to that initiator 405, the start and end addresses (e.g., [base 1 . . . end 1]) of each memory region onto which the device 415/420 is mapped are considered. Finally all the device regions are split so that there are no regions placed across other regions' boundaries.

The result of these steps are on one hand n arrays of stacks (1 per type of operation) for operations with a top-to-bottom direction and on the other hand y arrays of stacks (1 per type of operation) for the other direction i.e., bottom-to-top operations.

Therefore, an embodiment divides the stack of devices in y+n (2*n if y=n) arrays of adjacent stacks, each related to a contiguous address range. Thus, an embodiment offers that if a device receives an operation which results in the propagation of another operation with an address falling in the same range, the destination region is simply found in the next stack position related to that address range. This can be achieved statically and does not consume as much simulation time and cost as comparable decisions made at run time might cause. Furthermore, the event of the resulting propagation of another operation falling within an address in the same range as the original operation is a very frequent a case and typical for simulation models.

The above-described embodiment considers one initiator and the devices it can directly access. In that embodiment, the simulation kernel can be a part of the initiator that actually initiates the transaction, e.g., a model for the fetch unit plus load/store unit in a microprocessor-core model.

However, in cases for which multiple initiators 405 are to be considered, one layer may be implemented for each one of them. Thus, instead of arrays, in this case of multiple initiators y+n (2*n if y=n) matrices of stacks (1 per type of the operation and direction) is constituted. When considering a particular type of operation (for example, instructions, data, . . . ) and a particular direction of operation (top-to-bottom or bottom-to-top), the array of stacks obtained after having split the device regions for that particular operation and for that particular direction becomes a matrix of stacks which is also referred to herein as a "cube".

Figure 5:
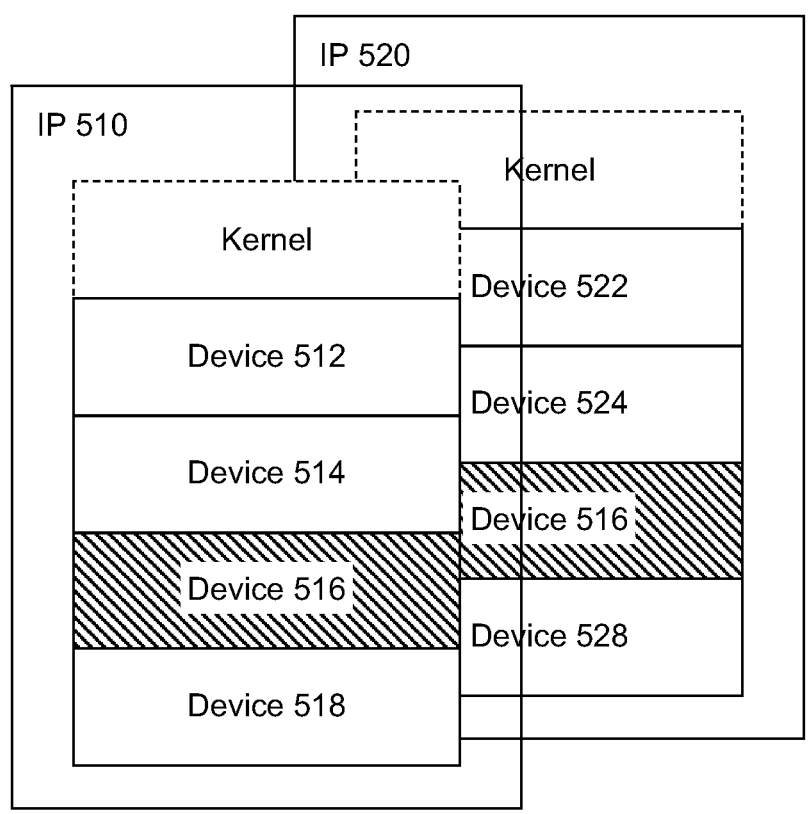
FIG. 5 shows a simplified matrix of stacks with devices mapped onto the whole address space in accordance with an embodiment.

FIG. 5 illustrates an embodiment of such a cube configuration 500. The cube 500 is illustrated in FIG. 5 with the simplification that all devices 512 to 528 are mapped onto the whole address space. Here again the Kernel is part of the initiator model that originated the transactions. The device 516 can be shared between more than one initiator. Examples for such device 516 can be a bus, a network, or a shared memory, a cache, or the like. Such a shared device 516 is instantiated once and referenced in more than one layer, which is illustrated in the exemplary embodiments shown in FIG. 5.

If there is more than one initiator in the system that is simulated, this is supported by an embodiment by repeatedly splitting the device regions such that there is no region placed across other regions boundaries, and building based on that n "cubes" for top-to-bottom operations (1 per type of the operation) and y "cubes" for bottom-to-top operations (1 per type of the operation). This is applied until there is no region across other regions' boundaries.

This splitting of device regions and building of cubes may be further optimized by avoiding splitting regions too much. In order to achieve that, a device page is defined that has a reasonable size. Further, regions occupying only a portion of that page are considered as if those regions occupied the entire page. This optimization may introduce a small requirement to the expected behavior of each region handler in a device model, because it can receive also requests that are not directed to it. Each region-handler code, therefore, may filter those corner cases by testing if it really mapped the effective address of a request, and if so, processing it, or alternatively by propagating it, preserving its direction and channel.

Figure 6:
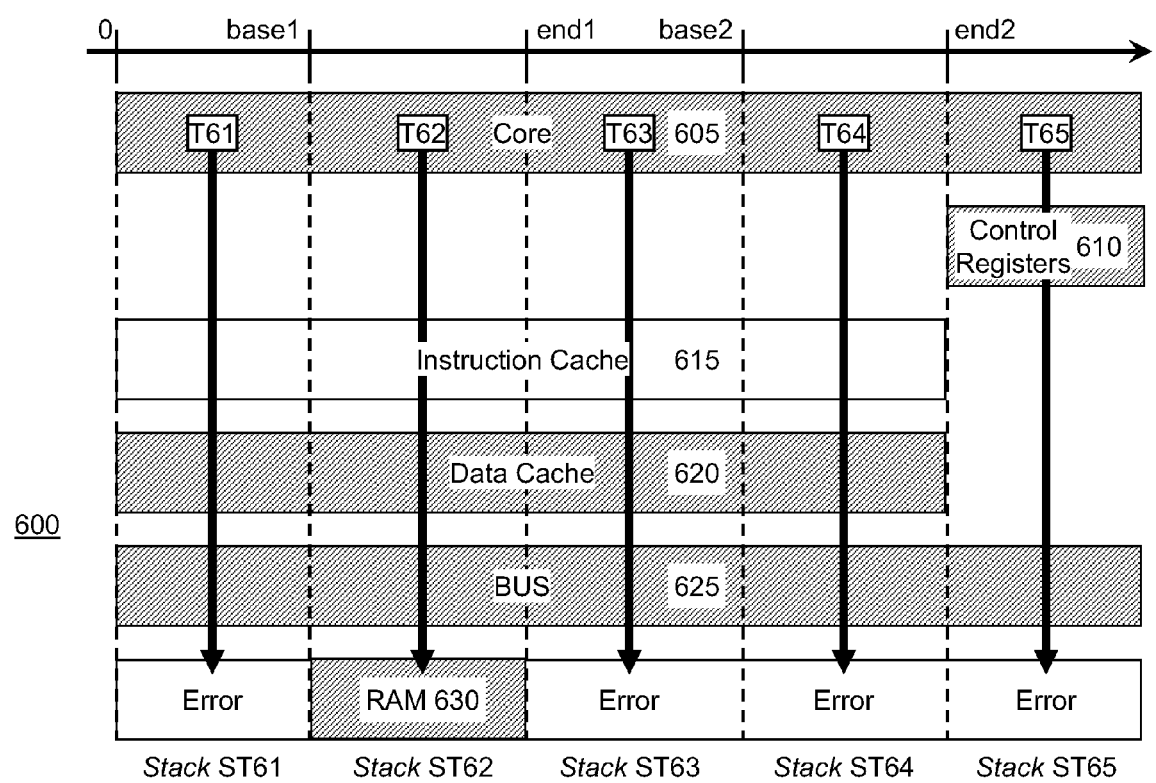
FIG. 6 shows an example of stacks for data operations in accordance with an embodiment.

With reference to FIG. 6, a further embodiment is discussed. In particular, once the transactions T61 to T65 start, the stacks ST61 to ST65 are determined, and unless there is an address shift, the sequence of device regions the transactions encounters is determined statically. Thus, propagating the transaction to the next device simply means sending it to the device region occupying of the next stack position. Further, there is a spatial proximity between the address ranges, referenced at almost the same time. If a particular address range is referenced at a particular time, then it may be likely that nearby address ranges will be referenced in the near future. This can be used to optimize an embodiment for faster access. In particular, because of spatial locality, there may be a high probability that if the address of the transaction is contained in the stack, then the next transaction will regard the same stack. This implies that the small overhead given by the point of statically determining the sequence of the device regions is performed in the minority of cases. However, this in any case may be less complex and (simulation) time consuming than a solution performing the choosing of address ranges at runtime.

Furthermore, embodiments are not limited to having a single set of stacks. In contrast, stack sets can be distinguished according to the type of operations like, for example, instructions, data, and the like. This allows instruction operations to skip the data cache, for example, because the stacks for instruction operations will not contain the data cache. Such an example is shown in FIG. 6 which illustrates an example of a stack set ST61-ST65 for data operations. In particular, instruction cache 615 is skipped as here only data operations are considered, and thus instruction-related devices like device 615 do not have to be considered.

Figure 7:
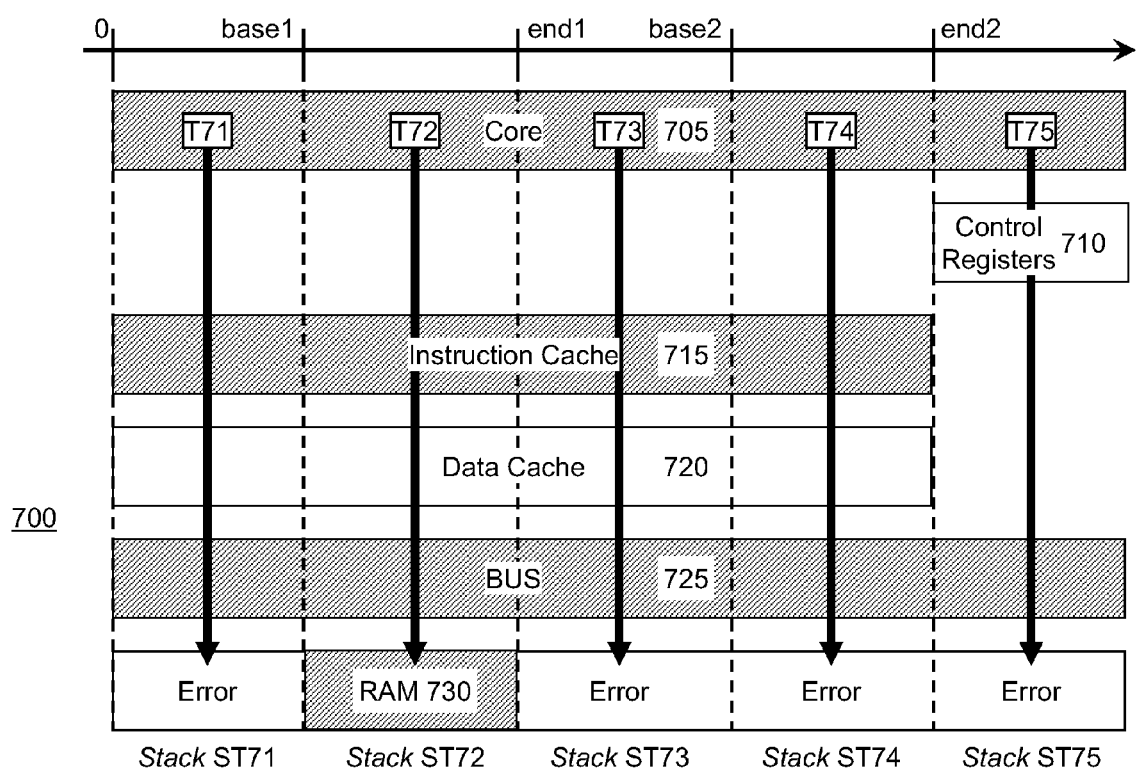
FIG. 7 shows an example of stacks for instruction operations in accordance with an embodiment.

A further example is highlighted in FIG. 7. The configuration 700 illustrates an example of a stack set for instruction operations. Here, in contrast to configuration 600 of FIG. 6, the instruction-related devices 715 are considered and the data related devices 720, 710 are skipped for propagating of the instruction operation.

The exemplary configurations 600/700 of FIG. 6/7 consider one master IP 705/605 and transactions traversing the stacks from top-to-bottom. However, a master IP can at least in some cases be a slave IP, too. In those cases the stacks ST71 to ST75 may also be traversed from the bottom-to-top, for example, from the bus to the master IP. Such situation may occur when there is more than one initiator 705 in the system, and one initiator needs to access, for example, a control register 710 contained in the other master IP. This case, however, can also occur when memory 730 is located before the bus 725, for example, in case it is local to a core and can be accessed by other cores. Such a case is highlighted in FIG. 8.

Figure 8:
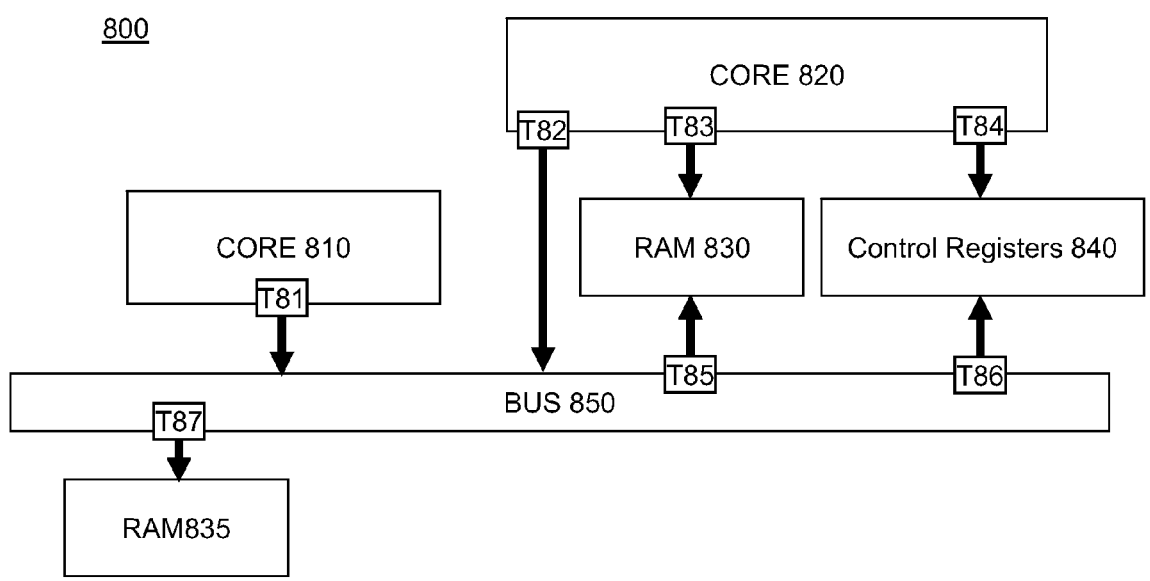
FIG. 8 shows an example of a structure model with two master IPs.

FIG. 8 shows two cores 820 and 810 and devices 830 to 850. Here, transaction T81 is initiated by core 810 as a top-to-bottom operation. However, in case this operation T81 is directed to RAM 830 and/or control register 840, the initial transaction T81 results in a bottom-to-top operation T85 and/or T86.

This situation indicates the further concept of "channels" as a part of a technique according to an embodiment. In particular, each device region has one or more channels wherein each channel is characterized by the type of operations it can handle, for example, instructions, data, or the like. Further, each channel is characterized by the direction from where it can receive operation requests (for example, top-to-bottom or bottom-to-top). At least two types of operation directions may be considered, namely first top-to-bottom, i.e., operations originated by the initiator and second bottom-to-top, i.e., operations directed to the initiator. However, this embodiment could further be extended if needed to enclose further possible directions of operations.

Figure 9:
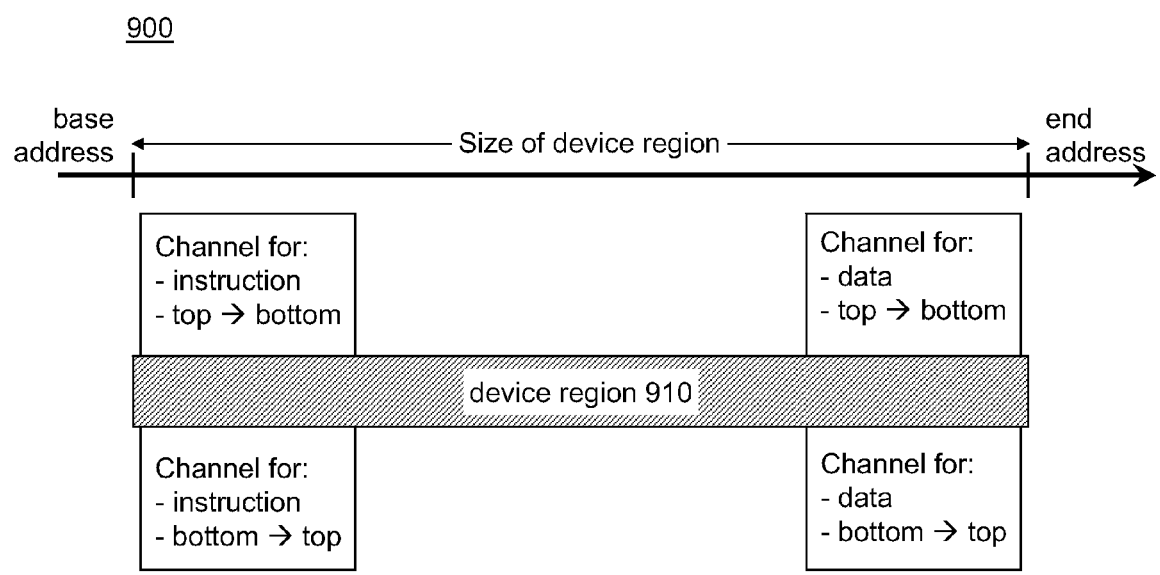
FIG. 9 illustrates channels within a device region.
Figure 10:
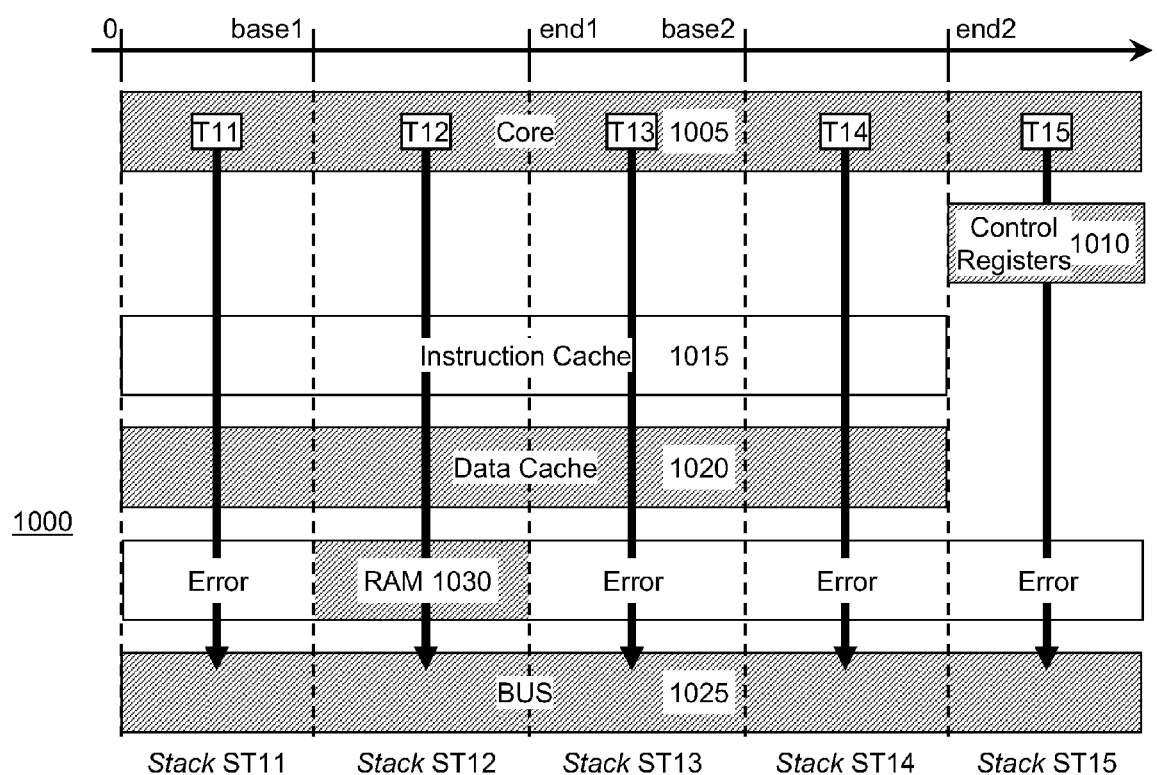
FIG. 10 illustrates an example of a top-to-bottom data operation in accordance with an embodiment.

Nevertheless, an embodiment with two operation directions is depicted in FIG. 9. Configuration 900 shows device region 910 that has four channels, two for instructions and two for data. The instruction channels are first for the direction for top-to-bottom and second for bottom-to-top. Similarly, the channels for data operations are one for top-to-bottom and one for bottom-to-top operations. Thus, the two sets of stacks (one for instructions and one for data operations) could be used unchanged and traversed from the bottom to the top for modeling bottom-to-top operations. However; as devices sensitive to operations coming from a bottom direction are usually very few in such hardware configurations compared to the number of devices sensitive to operations coming from the top, two other sets of stacks may be generated specifically for use in these types of operations. An example for such a configuration is shown in FIG. 10. In particular, configuration 1000 illustrates an example of a configuration where memory 1030 is located before the bus 1025. Thus, configuration 1000 illustrates an exemplary configuration of top-to-bottom data operation. This top-to-bottom data operation is followed by a bottom-to-top data operation which is highlighted in FIG. 11 with the exemplary configuration 1100.

Figure 12:
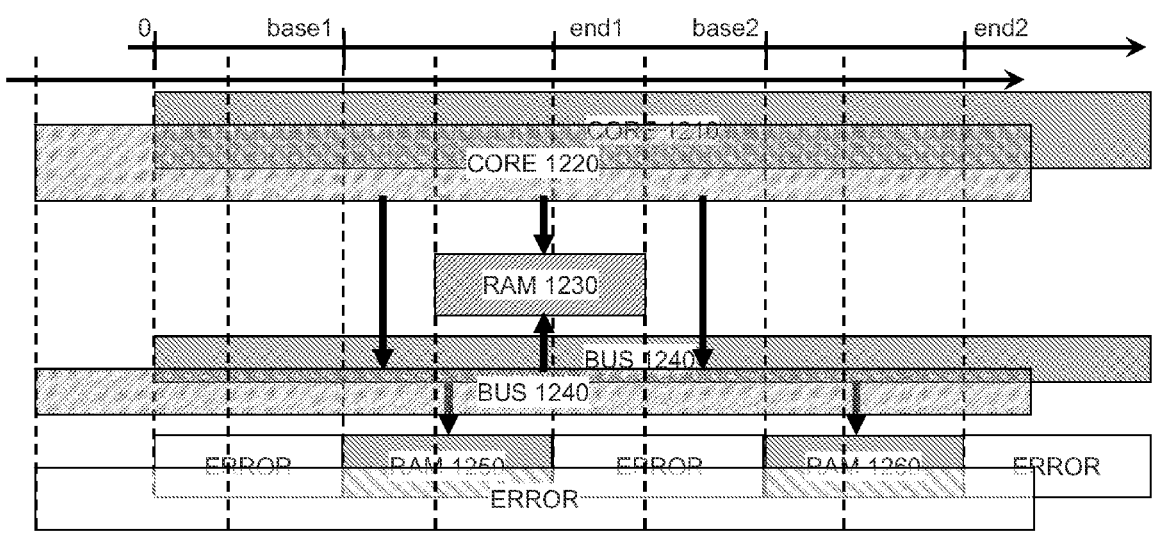
FIG. 12 illustrates an example for the stacked structure of a multi-initiator platform.

This stack structure can be replicated for each initiator that is present in the simulated system 1100, and each of those replicated as stacked structures is called a "layer" herein. An example for such a layer structure is highlighted in FIG. 12 with the exemplary configuration 1200.

Figure 11:
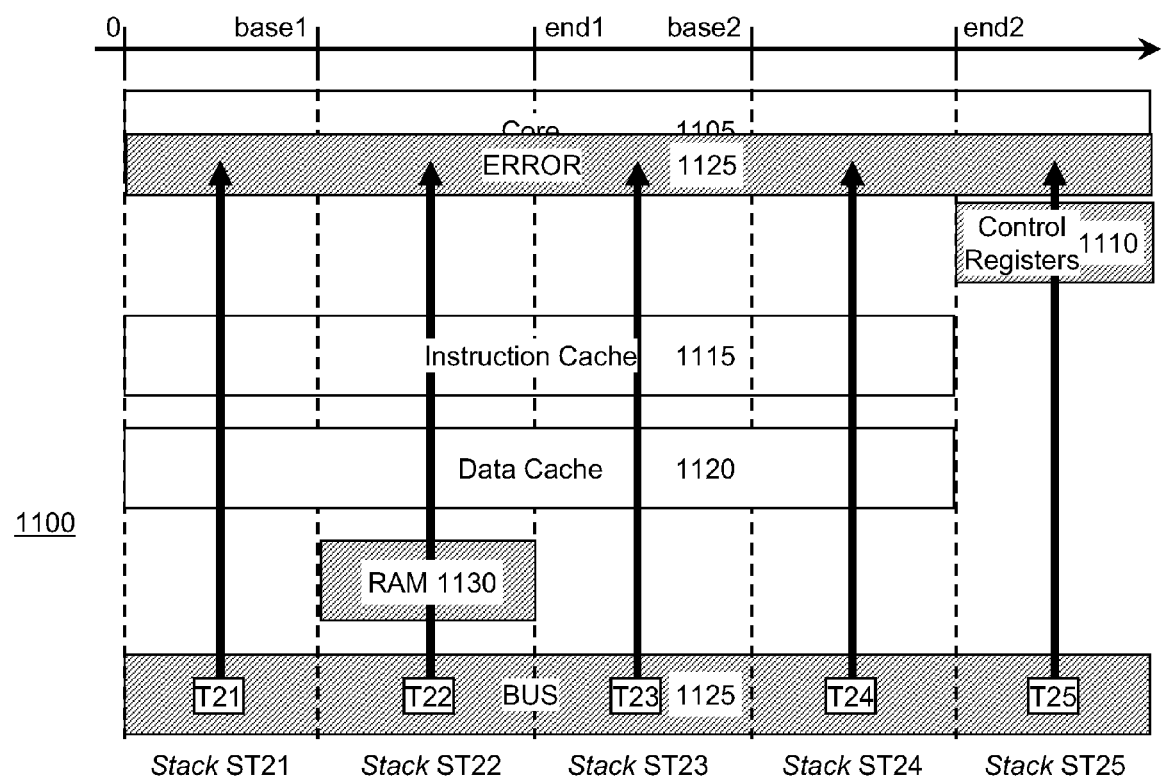
FIG. 11 illustrates an example of a bottom-to-top data operation in accordance with an embodiment.

On the top of each layer there is the kernel of the master IP 1220/1210. This may be the case if the layer belongs to a core model. The core simulation kernel typically cannot be a slave IP. This results in the last stack position for bottom-to-top operations always creating a memory error for layers belonging to the core. This situation is depicted in FIG. 11 with Error 1125. Devices 1250/1260, which are specific to a respective layer, are contained in only that layer. Devices that are shared among layers, for example bus 1240, are contained in, and, therefore, shared by all the layers present. The bus 1240 is such a shared device that can offline scan the devices 1210-1250 and create a map of the memory range containing the layer and the direction (memory range—[layer, direction]). Thus, at runtime, bus 1240 will be able to redirect the memory accesses it receives to the correct slave IP. This means changing layer and/or direction if necessary.

That means that in an embodiment, a bus simply is a "switch" that, according to the address of the transaction, determines the destination layer. The switch is performed by changing the layer and propagating the access to the device that is logically after the bus farthest from the initiator if the bus model can determine that the target device to access is farther from the initiator with respect to the bus, or to the device logically before the bus nearest to the initiator if the bus determines that the target device is nearer to the initiator with respect to the bus. The bus can, therefore, be programmed to discriminate between types of devices it can access and to offline scan the system topology for determining for each address range the destination layer and the direction in terms of top-to-bottom or bottom-to-top operations.

Thus, devices may be associated with device regions each containing one or more channels and one, two, or more possible directions of operations. Those device regions are stacked, and these stacks are organized such that no regions are placed across other regions' boundaries, which implies the possible splitting of device regions. In cases when there is more than one initiator present in the simulated system, for each initiator such a structure is generated resulting in structure layers. Those layers are created such that when a device is private, it is contained just in one layer, but when it is shared, it is contained in all the layers associated with all the initiators that can have access to it.

Figure 13:
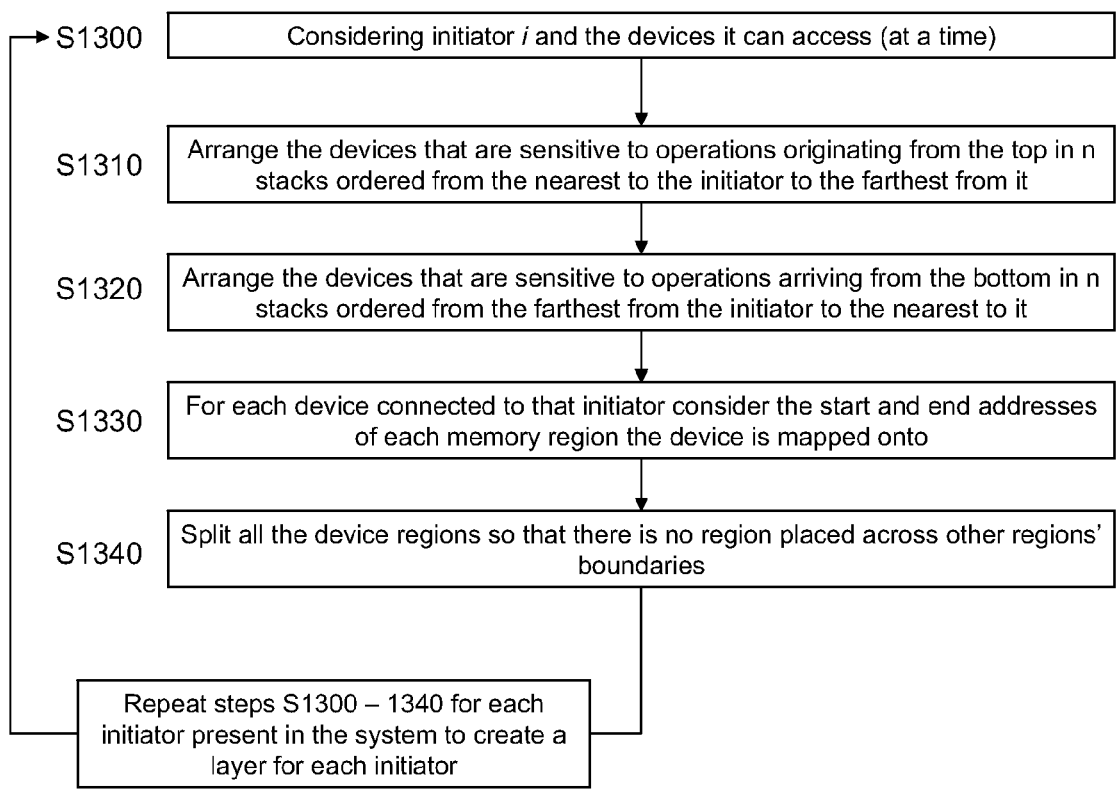
FIG. 13 depicts a flow chart for illustrating the operation of a simulation system in accordance with an embodiment.

A flowchart depicting the steps of operation according an embodiment is illustrated in FIG. 13. The embodiment of a method starts with step S1300 by considering one of the initiators (at a time) being present in the system with the devices that it can access. Further, in step 1310, the devices that are sensitive to operations originated from the top are arranged in n stacks ordered from the nearest to the initiator to the farthest from it (in terms of their proximity). For each type of operation supported by the device, one stack is created wherein n is at least 2 for instruction and data operations. Furthermore, in step 1320, devices that are sensitive to operations arriving from the bottom are arranged in y stacks (y may equal n) ordered from the farthest from the initiator to the nearest to it (in terms of proximity). Here, y is also at least 2 for instruction and data operations. One stack is created for each type of operation supported by the device.

Further, in step S1330, for each device coupled to that considered initiator, the start and end addresses of each memory region the device is mapped onto are considered. Based on that, in step 1340, all the device regions are split such that there are no regions placed across other regions' boundaries. The result of step 1340 is an array of stacks for top-to-bottom operations and also an array of stacks for bottom-to-top operations. In case there is more than one initiator present in the system, further layers are identified. In that case, the previous steps 1300 to 1340 are repeated for each initiator present in the system to create a layer for each of those initiators being present. The results of this process are y+n matrices of stacks, one per type of operation and direction. Thus, "cubes" are created as matrixes of stacks obtained for a particular type of operation (instruction, data, . . . ) and a particular direction (top-to-bottom, bottom-to-top, . . . ).

Therefore, an embodiment regards memory accesses and memory regions. Resets, clocks, and interrupt signals can be treated and coupled differently. Thus, an embodiment can be used for all memory-mapped devices in a system that is simulated. Thus, an embodiment provides an improved method and system for simulation and optimizing electronic hardware configurations. Further, it simplifies the definition of a system configuration. In particular, according to a known system, the coupling of devices is expressed in terms of which output ports of which devices are coupled to which input ports of which devices. According to an embodiment, however, devices are instead simply listed in terms of addresses they are mapped onto, operations (instructions and/or data) they are sensitive to, and in terms of their proximity to their initiators, and the connections are implicitly derived from this description. This simplifies, for example, the insertion or the removal of a device from a system. Considering a configuration where a device A is coupled to a device B, which is coupled to a device C, in case device B is to be temporarily removed from the system, in a known simulation environment the output ports of A are to be recoupled to the input ports of device C. However, according to an embodiment, it is sufficient to comment out the definition of B. This results in much simpler development tools.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A computer-implemented method for implementing and simulating in a software-based simulation environment hardware and device structures of multi-device platforms enabling high speed routing and dispatching of a given transaction to all simulation entities being involved in that given transaction, the method comprising:

providing for each electronic device comprised in a multi-device platform a device model for simulation in a software-based simulation environment executing on a processor, each device model storing a set of properties, the set of properties at least including a proximity value, and categorizing one or more of the device models as initiator model;

joining the device and the one or more initiator models in the simulation environment executing on the processor to from one or more simulation subsystems, each subsystem comprising one of the one or more initiator models and the device models that are connected to that one initiator, and combining the subsystems in the simulation environment to form a simulation system model of the multi-device platform, the simulation system model also executing on the processor and including executing the operations of, mapping each device onto one or more device regions of contiguous memory addresses in the address space of the system model;

creating for each of the one or more initiator models present in the system model a layer by repeating for each of the one or more initiator models the operations of, arranging based on the proximity value the device models that are sensitive to operations originating from the top in n stacks ordered from the nearest to the one or more initiators to the farthest from the one or more initiators;

arranging based on the proximity value the device models that are sensitive to operations arriving from the bottom in n stacks ordered from the farthest from the one or more initiator to the nearest to the one or more initiator;

defining for each device model connected to the one or more initiators a start address and an end addresses of each device region that the device model is mapped onto, each of the start and end addresses defining a boundary of the device region; and splitting all the device regions so that there is no device region placed across the boundary of another device region; and determining statically, in response to a given transaction being received at a first device and resulting in the propagation of the transaction, a target device region of that propagated transaction.

2. The methods according to claim 1, wherein at least one device model is shared between more than one initiator.

3. The method according to claim 2, wherein the at least one shared device model is configured as a bus, the bus device performing based on the proximity values a switch by changing the layer and propagating the given transaction to the device region that is logically after the bus farthest from the initiator having initiated the given transaction if the bus model can determine that the target device region to access is farther from the initiator with respect to the bus, or propagating the given transaction to the device region that is logically before the bus nearest to the initiator if the bus determines that the target device region is nearer to the initiator with respect to the bus.

4. The method according to claim 3, wherein the bus device is programmed to discriminate between types of devices it can access and to offline scan the system model topology for determining for each address range the destination layer and the direction in terms of top-to-bottom or bottom-to-top operations.

5. The method according to claim 1, wherein a simulation kernel of the simulation environment is part of the initiator model that originated the given transactions.

6. The methods according to claim 1, further comprising:
defining a device page with a size and considering device regions to occupy only a portion of that page as if those regions occupied the entire page; and
filtering by region handlers in each device model corner cases by testing if they really mapped the effective address of a transaction and if so processing it or alternatively by propagating it preserving its direction and channel.

7. A system, comprising:
a processor configured to execute a simulation system for implementing and simulating hardware and device structures of multi-device platforms, the simulation system including,
device models circuitry for simulation in a software-based simulation environment for each electronic device comprised in a multi-device platform, each device model circuit storing a set of properties, the set of properties at least including a proximity value, and categorizing one or more of the device model circuits as an initiator model circuit;
simulation subsystems circuitry formed based on joining the device models circuitry and the one or more initiator model circuits in the simulation environment, each subsystem circuit comprising one of the one or more initiator model circuits and the device model circuits that are connected to that one initiator model circuit;
a simulation system model circuit formed based on combining the subsystems circuitry in the simulation environment, the simulation system model including,
mapping circuitry that maps each device model circuit onto one or more device regions of contiguous addresses in the address space of the simulation system model circuit;
layer circuitry configured to create a layer for each of the one or more initiator model circuits present in the system model circuit, the layer circuitry configured,
to arrange based on the proximity values the device model circuits that are sensitive to operations originating from the top in n stacks ordered from the nearest to the one or more initiator model circuits to the farthest from the one or more initiator model circuits;
to arrange based on the proximity values the device model circuits that are sensitive to operations arriving from the bottom in n stacks ordered from the farthest from the one or more initiator model circuits to the nearest to the one or more initiator model circuits;
to define for each device connected to the one or more initiators a start address and end addresses of each device region the device is mapped onto, each of start address and each end address defining a boundary of the device region; and
to split all the device regions for each device model circuit coupled to the one or more initiator model circuits so that there is no device region placed across the boundaries of other regions; and
determination circuitry that statically determines, in response to a given transaction being received at a first device and resulting in the propagation of the transaction, the target device region of that propagated transaction.

8. The system according to claim 7, wherein at least one device model is shared between more than one initiator.

9. The system according to claim 8, wherein the at least one shared device model is configured as a bus, the bus device performing based on the proximity values a switch by changing the layer and propagating the given transaction to the device region that is logically after the bus farthest from the initiator having initiated the given transaction if the bus model can determine that the target device region to access is farther from the initiator with respect to the bus, or propagating the given transaction to the device region that is logically before the bus nearest to the initiator if the bus determines that the target device region is nearer to the initiator with respect to the bus.

10. The system according to claim 9, wherein the bus device is programmed to discriminate between types of devices it can access and to offline scan the system model topology for determining for each address range the destination layer and the direction in terms of top-to-bottom or bottom-to-top operations.

11. The systems according to claim 7, wherein a simulation kernel of the simulation environment is part of the initiator model that originated the given transactions.

12. The systems according to claim 7, further comprising:
means for defining a device page with reasonable size and considering device regions to occupy only a portion of that page as if those regions occupied the entire page; and
region handlers in each device model configured for filtering corner cases by testing if they really mapped the effective address of a transaction and if so processing it or alternatively by propagating it preserving its direction and channel.

* * * * *